(12) United States Patent
Hirota (10) Patent No.: US 8,273,999 B2
(45) Date of Patent: Sep. 25, 2012

(54) STRUCTURE FOR FASTENING METALLIC PLATE PARTS TOGETHER

(75) Inventor: Hideyuki Hirota, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 13/131,227

(22) PCT Filed: Dec. 11, 2009

(86) PCT No.: PCT/JP2009/006804
§ 371 (c)(1),
(2), (4) Date: May 25, 2011

(87) PCT Pub. No.: WO2010/109565
PCT Pub. Date: Sep. 30, 2010

(65) Prior Publication Data
US 2011/0229258 A1  Sep. 22, 2011

(30) Foreign Application Priority Data
Mar. 27, 2009 (JP) ................ 2009-079560

(51) Int. Cl.
*H01R 13/502* (2006.01)
(52) U.S. Cl. .......... 174/563; 361/724; 403/353
(58) Field of Classification Search ........... 403/353, 403/231, 252, 263, 380; 361/724; 174/560, 174/561, 563; 312/108, 111, 263, 265.5, 312/223.2
See application file for complete search history.

(56) References Cited

U.S. PATENT DOCUMENTS

| | | | |
|---|---|---|---|
| 5,944,398 A * | 8/1999 | Wu | 312/223.2 |
| 6,544,047 B2 * | 4/2003 | Moore | 174/376 |
| 6,903,933 B2 * | 6/2005 | Wang | 312/223.2 |
| 7,483,264 B2 * | 1/2009 | Chen et al. | 361/724 |
| 2003/0202319 A1 * | 10/2003 | Chen | 361/724 |
| 2005/0281004 A1 * | 12/2005 | Li | 361/724 |

FOREIGN PATENT DOCUMENTS

| | | |
|---|---|---|
| JP | 59-81065 U | 5/1984 |
| JP | 62-172180 U | 10/1987 |
| JP | 2005-348303 A | 12/2005 |
| JP | 2009-44041 A | 2/2009 |

* cited by examiner

*Primary Examiner* — Michael P Ferguson
(74) *Attorney, Agent, or Firm* — Birch, Stewart, Kolash & Birch, LLP (57) ABSTRACT

A chassis 2 as a first sheet-metal part has an L-shaped hooking section 27 formed at a cover mounting opening end of each side plate thereof, and an assembly guide section 28 dimpling inwardly the opening end of the chassis 2 by the thickness of a cover 8; the cover 8 as a second sheet-metal part has a hooking claw 81 extending from each side edge of the cover to the mounting side thereof and engaging with the L-shaped hooking section 27, and a guide lug 82 engaging with the assembly guide section 28, wherein an engaging claw 85 and an engaging hole 102, and a tapped hole 101 and a screw passing-through hole 84 are relatively provided on the abutment faces between the chassis 2 and the cover 8, respectively.

3 Claims, 6 Drawing Sheets

STRUCTURE FOR FASTENING METALLIC PLATE PARTS TOGETHER

FIELD OF THE INVENTION

The present invention relates to a structure for fastening sheet-metal parts together for assembling a sheet-metal cover to a sheet-metal chassis in an electric apparatus.

BACKGROUND ART

In an electric apparatus mounted on a moving body such as a motor vehicle, for example, when a sheet-metal cover is assembled to a sheet-metal chassis, the chassis and cover, that is, two sheet-metal parts, are fixed together with screws. For this reason, a large number of screws are used, it takes a long time for the assembly, and the disassembly is also troublesome. Therefore, reduction of the number of the used screws is expected, which leads to reduction of the number of fastening points; thus, there is a problem such that abnormal noise is generated in vibration.

On the other hand, an image forming apparatus of Patent Document 1 discloses an arrangement that in order to enable the interior of a copy carrying unit to be exposed from a lower face thereof at one operation, one end of a lower face member of a copy carrying path is rotatably supported by a copy carrying unit main body, a pin provided at the other end thereof is slidably engaged with a groove of a side wall provided at a rotating end of a bottom plate, whereby the lower face member of the copy carrying path is opened concurrently with opening of the bottom plate.

PRIOR ART DOCUMENTS

Patent Documents

Patent Document 1: JP-A-2005-348303

SUMMARY OF THE INVENTION

However, the structure disclosed in Patent Document 1 aims at arranging the lower face member of the copy carrying path to be opened concurrently with the opening of the bottom plate; thus, the structure cannot reduce the number of screws for fastening sheet-metal parts together and further restrain generation of abnormal noise in vibration.

The present invention has been made to solve the above-mentioned problems, and an object of the present invention is to provide a structure that reduces screw-fixing points, and implements easily an assembly thereof by only hooking configurations, thus improving the ability of the structure to be assembled and disassembled. Further, another object of the present invention is to implement a cover fastening structure that prevents loosening of screw-fixed portions by normally applying thereon tension due to the hooking configurations after the assembly, and also restrains abnormal noise to be generated because of vibration or the like.

A structure for fastening sheet-metal parts together according to the present invention includes: a first sheet-metal and a second sheet-metal parts to be assembled and fixed to each other, wherein the first sheet-metal part has an L-shaped hooking section formed at the opening end of each side plate thereof, and an assembly guide section dimpling inwardly a portion of the opening end by the thickness of the second sheet-metal part, wherein the second sheet-metal part has an L-shaped hooking claw for engaging with the L-shaped hooking section and a guide lug for engaging with the assembly guide section, with the claw and lug extending from each side edge of the second part to the side to be assembled, and wherein an engaging claw and an engaging hole, and a screw passing hole and a tapped hole are relatively provided on the abutment faces between the first sheet-metal part and the second sheet-metal part.

According to the present invention, the first sheet-metal and the second sheet-metal parts to be assembled and fixed to each other are arranged to be fastened to each other by the engagements between the hooking section and the hooking claw which are relatively provided in those parts and between the engaging hole and the engaging claw which are also relatively provided therein, thus enabling the two sheet-metal parts to be assembled together by reducing screw-fixing points, and further enhancing the ability of the parts to be assembled and disassembled.

Further, since the engagement faces between the hooking section and the hooking claw each have a taper formed thereon, such that the sheet-metal parts exert a pressing force on each other, after the assembly, the pressing force is normally exerted thereon, thereby preventing loosening of the screw-fixed portions and also suppressing abnormal noise to be generated due to vibration or the like.

DETAILED DESCRIPTION OF THE INVENTION

Embodiments of the present invention will now be described with reference to the accompanying drawings in order to explain the present invention in more detail.

First Embodiment

Figure 1:
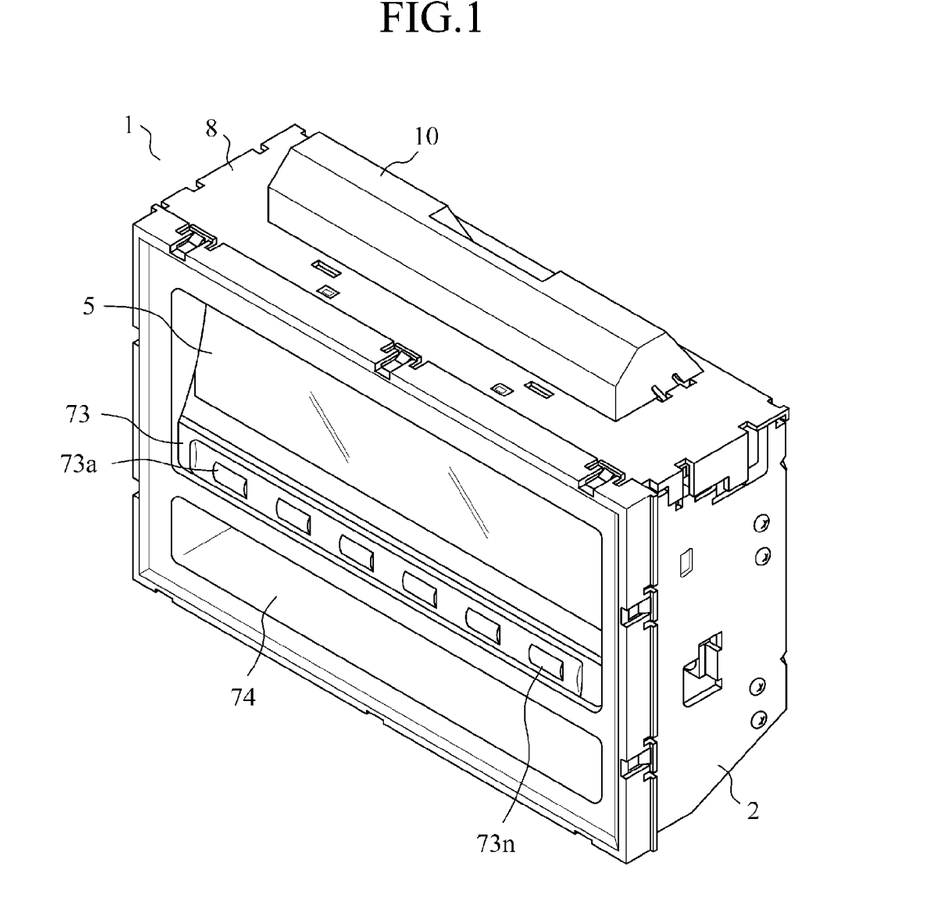
FIG. 1 is a schematic view of an electronic apparatus to which a structure for fastening sheet-metal parts together according to the present invention is applied.

In the following, a structure for fastening sheet-metal parts together according to the present invention will be described with reference to the drawings. The outline of an electronic apparatus to which the structure for fastening sheet-metal parts together according to the present invention is applied will now be discussed with reference to FIG. 1 and FIG. 2. An electronic apparatus 1 includes: a box shaped hollow chassis 2 as a first sheet-metal part; a board 3 to be assembled to the interior of the chassis 2; a display 4 to be assembled to the board 3; a panel 7 to be assembled to the chassis 2, while a filter 5 disposed opposite the display 4 is attached thereto together with a hood 6; and a cover 8 as a second sheet-metal part for covering an opening of the chassis 2 after assembling all of these parts.

Note that in the following descriptions, expressions of "upper and lower side plates," "front and back side plates," and also "right and left side plates" are based on a state where the electronic apparatus is disposed at an in-service position.

Figure 2:
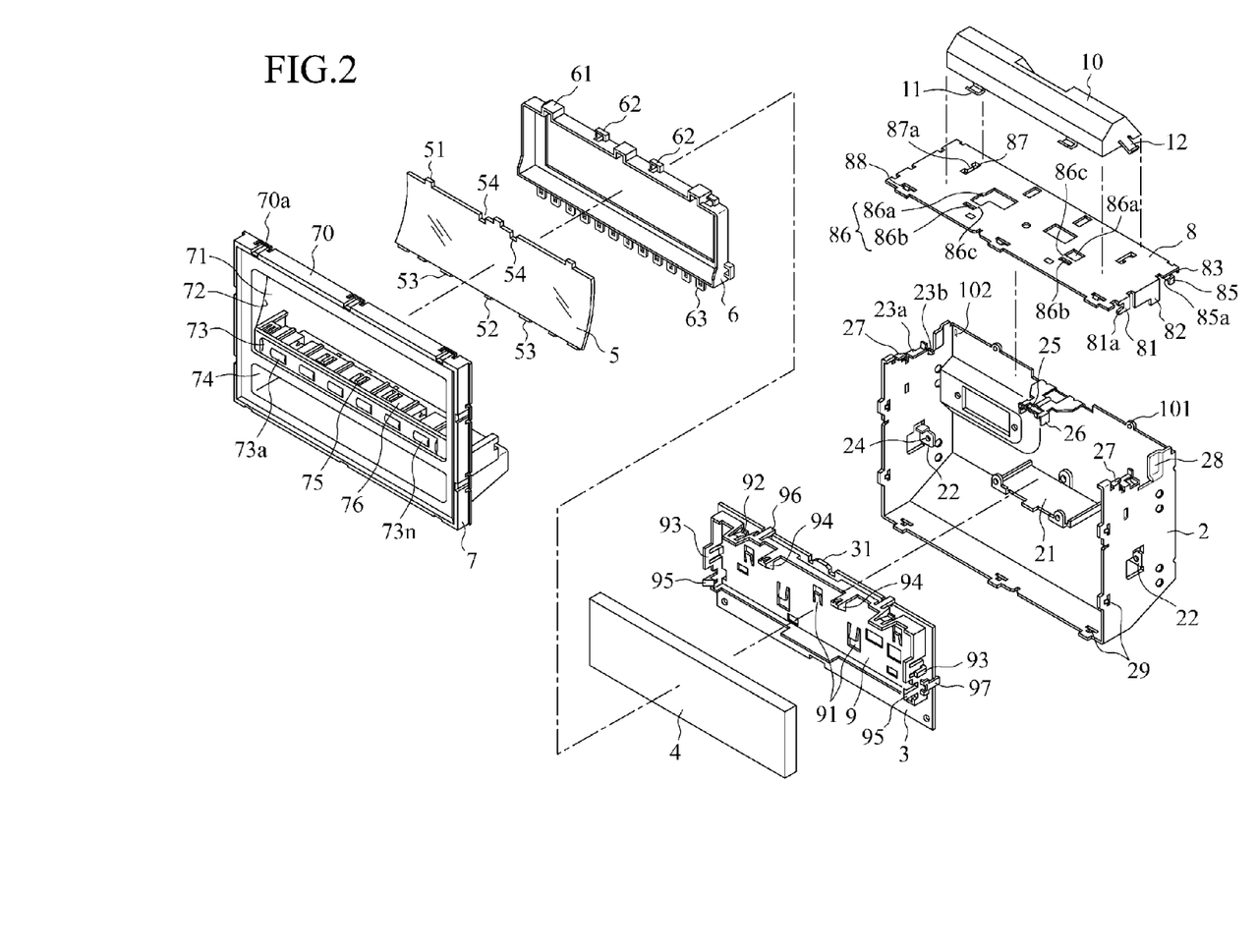
FIG. 2 is an exploded perspective view of the electronic apparatus.

The chassis 2 includes: a screw fixing section (also serving as a board receiver) 21 provided in the interior thereof; a first board receiving section 22 that is formed at the same height position as that of the screw fixing section (also serving as a board receiver) 21 by cutting and raising inwardly a portion of each side plate of the chassis 2; board gripping sections 23*a*, 23*b* (one of the sections is not shown) that are formed so as to grip the board 3 by cutting and raising inwardly another portion of each side plate of the chassis 2; a board assembling guide section 24 that is formed by folding a portion of the first board receiving section 22 at a substantially right angle toward the board mounting side; a rectangular opening engaging section 25 formed by turning at a substantially right angle at the upper edge of the back side plate of the chassis 2 so as to engage with a protrusion 31 formed at the edge of the board that is not fixed by screws, and also a second board receiving section 26 that is formed by horizontally extending from each side of the rectangular opening engaging section toward the interior of the chassis and formed at the substantially same height position as those of the screw fixing section (also serving as a board receiver) 21 and the first board receiving section 22.

Further, the chassis 2 is provided with an L-shaped hooking section 27 formed by bending inwardly a portion of a cover mounting opening end of each side plate thereof; an assembly guide section 28 dimpling inwardly the side of the opening end of the chassis 2 by the thickness of the cover 8 in the vicinity of the hooking section 27; and a tapped hole 101 and an engaging hole 102 formed through the upper part of the back side plate thereof.

The display 4 has a rectangular shape with a certain thickness. A holder 9 for holding the display 4 assembled thereto is made of a resin material, and includes: resilient lugs 91 serving as an urging unit in the direction of thickness, and formed on the bottom face by cutting and raising a portion of the bottom face so as to urge the display 4 mounted thereon in the direction of thickness; resilient lugs 92 working as an urging unit in the downward direction, and formed by cutting and raising inwardly a portion of the upper side plate so as to urge the display 4 toward the terminal side; resilient lugs 93 working as a sandwiching unit, and formed by cutting and raising inwardly a portion of each of the right and the left side plates so as to sandwich the display 4 from right and left; and resiliently engaging claws 94 and 95 serving as a surface pressing unit, and formed on the upper side plate and also the right and the left side plates so as to press the surface of the display 4.

Also, resiliently engaging claws 96 and 97 for assembling and fixing the holder 9 to the board 3 are formed on the back side plate and the right and left side plates of the holder 9 by extending in the direction of thickness. Further, engaging claws for engaging with holes of the board 3 are formed on the bottom face thereof; however, indications thereof is omitted in FIG. 2.

The panel 7 includes an assembling wall 70 relative to the chassis 2 therearound, and has a display window 71 that is formed internally of the panel a predetermined distance away from the upper side plate forming the wall 70; a filter mounting section 72 formed in the shape of a frame on the fringe of the display window 71; an operation button housing section 73 for housing a plurality of operation buttons 73*a* to 73*n* that are formed along the lower edge of the filter mounting section 72; and a glove compartment 74 that is formed and positioned between the operation button housing section 73 and the lower side plate of the wall 70. The upper and the lower side plates and the right and the left side plates forming the assembling wall 70 are provided with rectangular opening engaging sections 70*a* for engaging with the engaging claws formed on the chassis 2.

The hood 6 is made of a resin material in the shape of a frame, and has cover sections 61 and engaging holes 62 on the upper frame side plate thereof that is assembled to the outer face of the upper side plate of the filter mounting section 72. Further, the hood 6 has on the lower frame side plate thereof resiliently pressing sections 63 that are formed by projecting at a specific interval so as to abut against the bottom face of the operation buttons, and engaging projections (not shown) for engaging with engaging concavities (not shown).

The filter 5 is formed having a curved face to conform to the filter mounting section 72. At the upper end edge of the filter, there is provided with hooking resiliently engaging claws 51 having a taper that are formed at a specific interval so as to engage with rectangular opening engaging sections (omitted in FIG. 2) of the panel 7; and concavities 54 formed at the positions to be engaged by the protrusions (omitted in FIG. 2) formed in the filter mounting section 72, while at the lower end edge thereof, there is provided with engaging claws 52 and positioning convexities 53 formed so as to engage with the resiliently engaging claws 75 and the positioning concavities 76 formed on the outer face of the operation button housing section 73, respectively.

The cover 8 has hooking claws 81 for engaging with the L-shaped hooking sections 27 of the chassis 2, and guide lugs 82 for engaging with the assembly guide sections 28, with the hooking claws and the guide lugs formed by extending from the upper end edge of each side plate of the cover to the assembling direction; and also the cover has a right-angularly bent lug 83 that is superposed on the outer face of the back side plate of the chassis 2; screw passing holes (omitted in FIG. 2) opposed to the tapped holes 101 of the chassis; and engaging claws 85 for engaging with the engaging holes 102 thereof. It is preferable to provide a taper 85*a* on the engaging claw 85 such that the engaging claw easily engages with the engaging hole 102. Furthermore, four corners of the engaging hole 102 are arranged to have a circular arc portion and the circular arc portion 102*a* (see FIG. 7) is normally caused to come in contact with the engaging claw 85.

Figure 8:
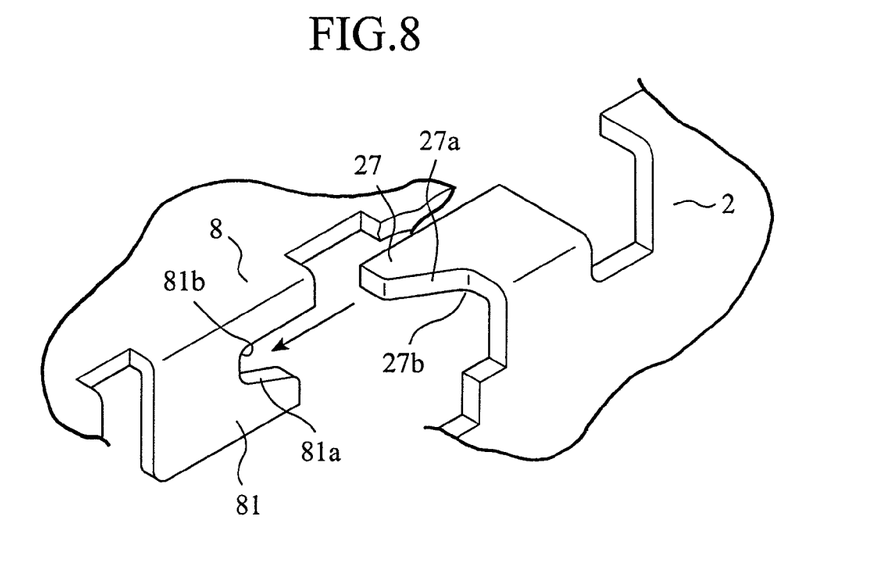
FIG. 8 is a perspective view before assembly showing a relationship between a hooking section and a hooking claw.

The engagement faces between the hooking section 27 and the hooking claw 81 are provided with tapers 27*a* and 81*a*, respectively (see FIG. 8) such that the chassis 2 and the cover 8 impart a pressing force to each other, and the terminal portions of those tapers 27*a* and 81*a* are formed having circular arc portions 27*b* and 81*b*, respectively (see FIG. 8). Further, the cover 8 includes engaging hole sections 86 formed by juxtaposing two holes 86*a*, 86*b*, and engaging lugs 87*a* formed by extending downwardly one side of the edges of a cut-raised hole 87.

On the other hand, in a case 10 assembled to the cover 8, substantially U-shaped resiliently engaging claws 11 also serving as a positioner that engage with the engaging hole sections 86 of the cover 8; and resiliently engaging claws 12 that extend downwardly so as to each pass through the cut-raised hole 87 of the cover 8 and normally engage with the lower end of the engaging lug 87*a* are formed at the opening end edge thereof opposed to the case 10.

In the following, assembly of the parts will be described. To assemble the display 4 to the holder 9, as the display 4 is pressed to the holder 9 from the top face thereof, the display 4 advances while outwardly pressing and widening the resilient lugs 92, the resilient lugs 93, and the resiliently engaging claws 94 and 95, and further advances while depressing the resilient lugs 91.

Then, as the display 4 passes therethrough, the resilient lugs 92 urge the display 4 to a terminal side, the resilient lugs 93 sandwich the display 4 from right and left, and the resilient engaging claws 94 and 95 press and maintain the face of the display 4 forced upwardly by the urging force of the resilient lugs 91, thus completing the assembly of the display 4 to the holder 9. After completion of the assembly (note that the following may be performed before the assembly of the display), the holder 9 is assembled to the board 3 with the resilient engaging claws 96 and 97, and the engaging claws (not depicted), as shown in FIG. 2.

Next, the board 3 having the display 4 assembled thereto is mounted on the first board receiving sections 22 formed on each side plate of the chassis 2 to be moved in the assembling direction and be sandwiched at both side edges thereof by the board gripping sections 23a, 23b. At the movement terminated position, the board 3 is mounted on the second board receiving section 26 at the moving front end thereof, and the protrusion 31 formed at the end edge of the board that is not fixed by screws enters the rectangular opening engaging section 25. In this state, the board 3 is mounted on the screw fixing section (also serving as a board receiver) 21 at the back end side thereof to be fixed by screws.

On the other hand, when the cover 8 is assembled to the opening of the upper face of the chassis 2, the guide lug 82 of the cover 8 is moved along the assembly guide section 28 of the chassis 2 to cause the cover 8 to abut against the opening end face of the chassis 2, thus preventing the cover 8 from being too much drawn to the side of the chassis to be lowered.

Next, the cover 8 is moved until the right-angularly bent lug 83 abuts against the outer face of the back side plate of the chassis 2 in a state where the cover is abutted against the opening end face thereof to thereby engage the hooking section 27 with the hooking claw 81, and then adjust these lateral and vertical positions to be in mesh with each other. In this case, since the hooking section 27 and the hooking claw 81 are formed with a taper: an entrance thereof widen and a root thereof narrow, the hooking section and the hooking claw are easily combined to each other, and also they can be firmly secured to each other in the combined state. Further, by providing circular arc portions 81b at the roots of the hooking section 27 and the hooking claw 81, respectively, the hooking section 27 and the hooking claw 81 are caused to normally come in contact with each other, thus enabling the two engaging members to be maintained at tension.

Further, as the right-angularly bent lug 83 of the cover 8 is abutted against the outer face of the back side plate of the chassis 2 to be superposed, the engaging claw 85 formed at the right-angularly bent lug 83 engages with the engaging hole 102 of the back side plate of the chassis 2, and thereby the cover 8 is positioned and held to the chassis 2. Therefore, while maintaining this state, a screw (omitted in FIG. 2) passed through the screw passing hole of the right-angularly bent lug 83 is screwed into the tapped hole 101 of the chassis 2 to be screw-fixed. In this case, the engaging claw 85 has the taper, and the four corners of the engaging hole 102 are formed with a circular arc portion. Thus, the engaging claw 85 is easily inserted into the engaging hole 102, the engaging claw 85 is normally in contact with the corner of the circular arc portion of the engaging hole 102, and the back plate of the chassis 2 is gripped between the cover 8 and the engaging claw 85, thus enabling the cover and the chassis to be maintained at tension.

On the other hand, to assemble the filter 5 to the panel 7, as the hooking engaging claw 51 of the filter 5 is first engaged with the rectangular opening engaging section 70a of the panel 7 to press the side of the lower end of the filter against the one of the panel, the resiliently engaging claw 52 engages with the engaging claw 75 on the side of the panel in this process, and also the positioning convexity 53 engages with a positioning concavity (omitted in FIG. 2) on the side of the panel, thus assembling the filter 5 to the panel 7.

After assembling the filter, the peripheral portion of the hood 6 is fitted in an L-shaped drawing positioning section (omitted in FIG. 2) on the side of the panel such that the peripheral portion of the filter is covered, and engaging claws (omitted in FIG. 2) on the side of the panel are engaged with the engaging holes 62. This assembly causes the cover sections 61 to cover rectangular opening engaging sections (omitted in FIG. 2) located on the side of the panel, and the resilient pressing sections 63 abut against the bottom faces of the operation buttons 73a-73n to impart a restoring force to the operation buttons.

The wall 70 of the panel 7, to which the filter 5 and the hood 6 have been thus assembled, is fitted in the front opening of the chassis 2 having the board 3 assembled thereto as discussed above, and cut-raised engaging claws 29 formed on the chassis 2, and cut-raised engaging claws 88 of the cover 8 are engaged with the rectangular opening engaging sections 70a formed on the wall 70, thus completing the assembly of the electronic apparatus 1.

Moreover, before the assembly or after the completion of the assembly as mentioned above, the case 10 is assembled and fixed to the cover 8. In this case, the substantially U-shaped resiliently engaging claws 11 of the case 10 are inserted from the holes 86a located in the upper face of the cover 8, further the case 10 is rotated from this state to the side of the cover 8 to thereby insert the tip portions of the resiliently engaging claws 11 into the holes 86b from the lower face of each of partition sections 86c located between the holes 86a, 86b to thus perform these positionings in a lateral direction, and then the engaging claws 12 are inserted into the cut-raised holes 87 to be engaged with the engaging lugs 87a, thus enabling the case 10 to be firmly assembled to the cover 8 without screws.

Figure 3:
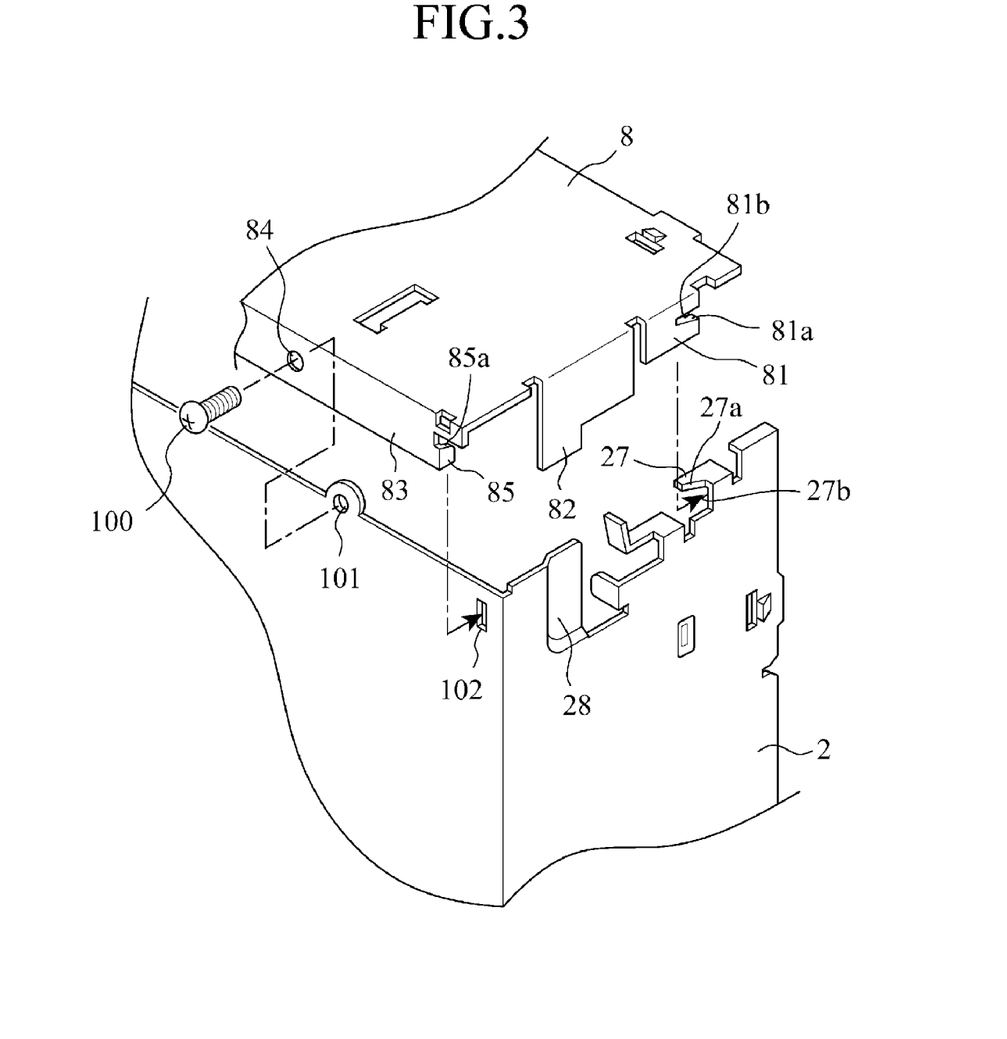
FIG. 3 is an exploded perspective view of a main area of a chassis and a cover.
Figure 4:
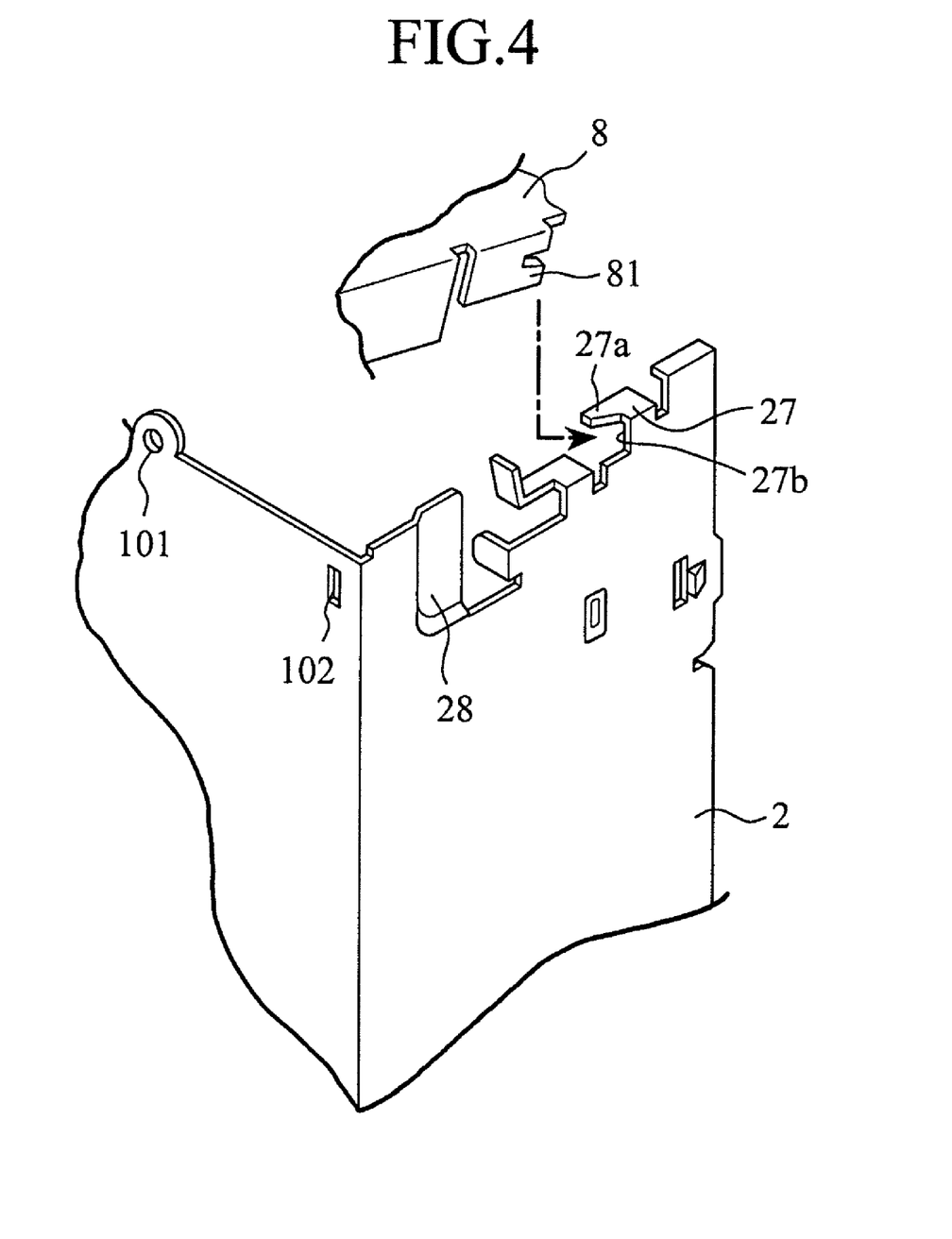
FIG. 4 is a perspective view showing a process where the cover is assembled to the chassis.
Figure 5:
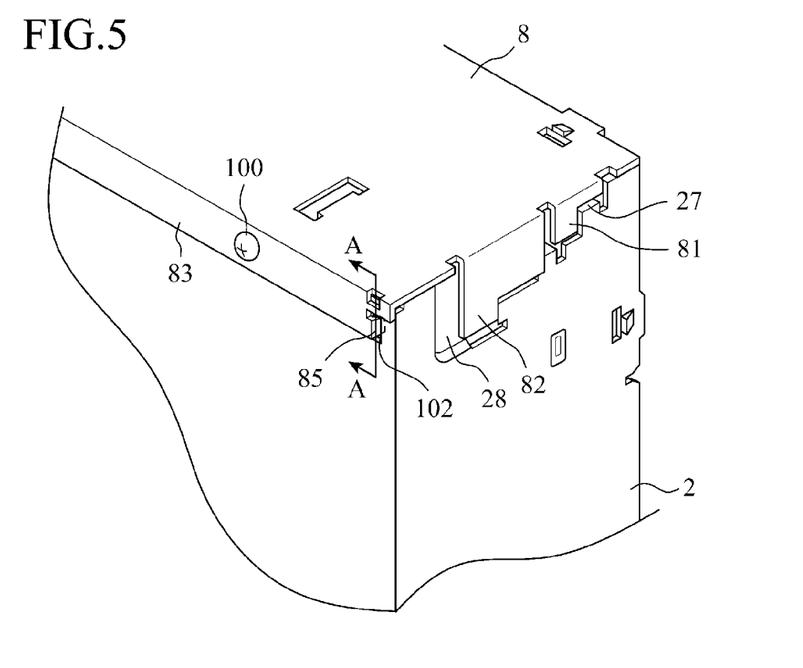
FIG. 5 is a perspective view showing an assembled state of the chassis and the cover.
Figure 6:
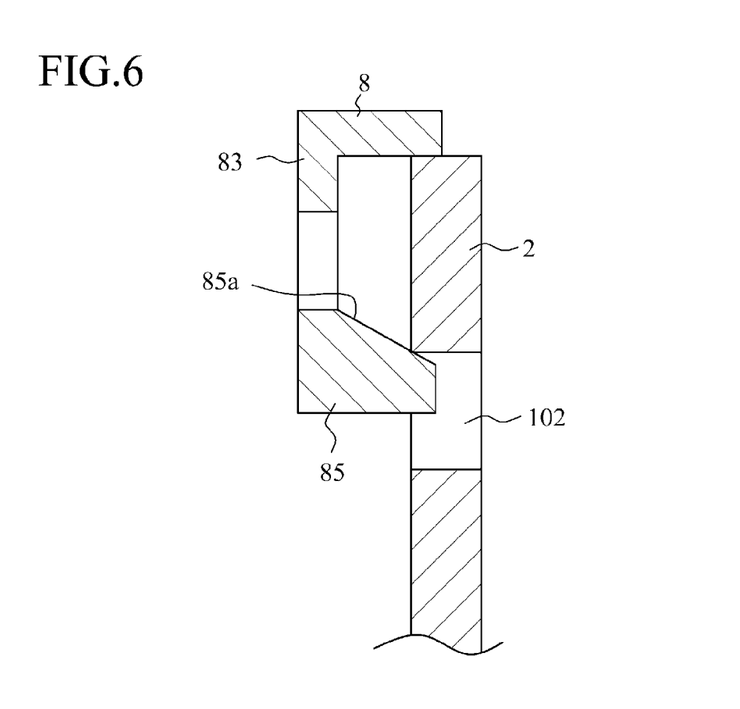
FIG. 6 is an enlarged sectional view along the line A-A of FIG. 5.
Figure 7:
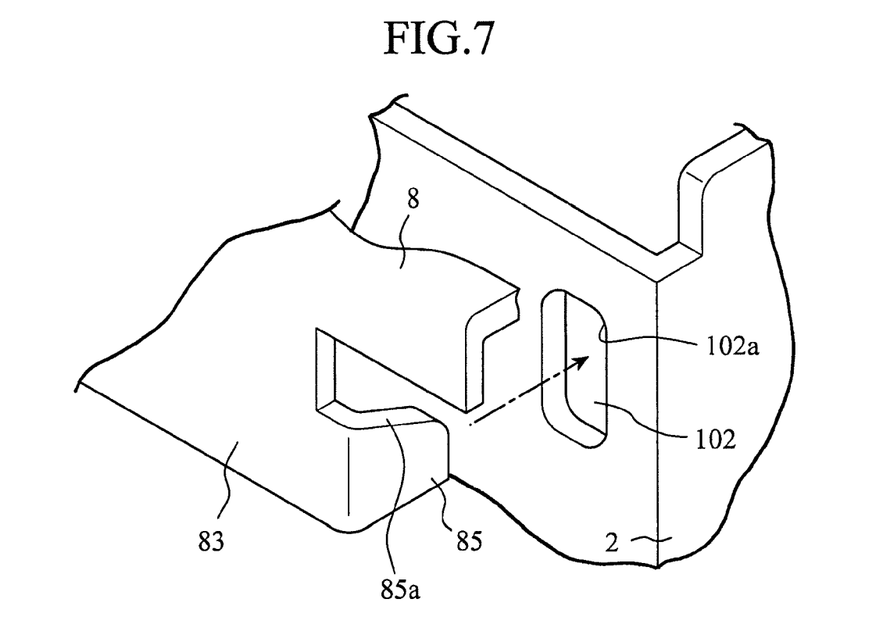
FIG. 7 is a perspective view before assembly showing a relationship between an engaging hole and an engaging claw.

In the electronic apparatus 1 thus arranged, the purport of the present invention is in that an assembly of the cover 8 as the second sheet-metal part to the opening of the chassis 2 as the first sheet-metal part is contrived. FIG. 3 is an exploded perspective view of a main area of the chassis and the cover, FIG. 4 is a perspective view showing a process where the cover is assembled to the chassis, FIG. 5 is a perspective view showing an assembled state of the chassis and the cover, FIG. 6 is an enlarged sectional view along the line A-A of FIG. 5, FIG. 7 is a perspective view before assembly showing a relationship between the engaging hole and the engaging claw, and FIG. 8 is a perspective view before assembly showing a relationship between the hooking section and the hooking claw.

In the chassis 2 in the structure for fastening sheet-metal parts together of the invention, the following is formed: the L-shaped hooking sections 27 formed at the cover mounting opening end of each side plate thereof; the assembly guide sections 28 dimpling inwardly the side of the opening end of the chassis 2 by the thickness of the cover 8 in the vicinity of the hooking section 27; and the tapped holes 101 and the engaging holes 102 through the back side plate thereof.

In the cover 8, there is provided with the hooking claws 81 formed by extending from each side edge thereof to the assembling side so as to engage with the L-shaped hooking sections 27; and the guide lugs 82 formed so as to engage with the assembling guide sections 28. Also, the cover has the right-angularly bent lug 83 to be superposed above the back side plate of the chassis 2; the screw passing holes 84 opposed to the tapped holes 101 of the chassis; and the engaging claws 85 for engaging with the engaging holes 102 of the chassis.

The engagement faces between the hooking section 27 and the hooking claw 81 are provided with the tapers 27a, 81a, respectively, such that the two sheet-metal parts impart pressing force to each other, and those tapers 27a, 81a have the circular arc portions 27b and 81b, respectively, formed at the respective terminal portions thereof. Besides, the engaging claw 85 is provided with the taper 85a such that the engaging claw easily engages with the engaging hole 102, and also the four corners of the engaging hole 102 each have the circular arc portion 102a.

With the above construction, in assembling the cover 8 to the opening of the chassis 2, the guide lug 82 of the cover 8 is moved along the assembly guide section 28 of the chassis 2 in the assembling direction to abut the cover 8 against the end face of the opening of the chassis 2, thus preventing the cover 8 from being too much drawn to the side of the chassis to be lowered.

Next, the cover 8 is laterally moved with the cover abutted against the opening end of the chassis 2 to engage the hooking section 27 with the hooking claw 81, and adjust these lateral and vertical positions to be in mesh with each other. In this case, since the hooking section 27 and the hooking claw 81 is formed with the tapers 27a, 81a, respectively, such that entrances thereof widen and roots thereof narrow, the hooking section and the hooking claw are easily combined to each other, and also the hooking section 27 and the hooking claw 81 impart a pressing force to each other with the tapers 27a, 81a in the combined state to be firmly fastened to each other. Furthermore, since the circular arc portions 27b and 81b are provided at the roots of the tapers 27a, 81a of the hooking section 27 and the hooking claw 81, respectively, the hooking section 27 and the hooking claw 81 are normally in contact with each other, thus enabling the two engaging members to be maintained at tension.

Moreover, as the cover 8 is transversely moved to thereby superpose the right-angularly bent lug 83 of the back end portion of the cover on the back plate of the chassis 2, the engaging claw 85 formed at the right-angularly bent lug 83 is inserted and engaged with the engaging hole 102 of the back side plate of the chassis 2, and the cover 8 is positioned and held to the chassis 2. Therefore, while maintaining that state, the screw 100 passed through the screw passing hole 84 of the right-angularly bent lug 83 is screwed into the tapped hole 101 of the chassis 2 to be screw-fixed. In this case, the engaging claw 85 has the taper 85a, and the four corners of the engaging hole 102 are formed with the circular arc portion 102a, the engaging claw 85 can be easily inserted into the engaging hole 102, thereby providing a state that is normally maintained at tension owing to the taper 85a after the insertion.

As discussed above, according to the invention, the cover is assembled to the chassis by meshing engagement between the hooking section and the hooking claw relatively formed in the chassis and the cover and engagement between the engaging claw and the engaging hole similarly relatively formed therein, thus assembling the two sheet-metal parts together by reduced screw-fixing points, which can contribute to enhancement of the ability of the parts to be assembled and disassembled.

Moreover, since the tape is formed on the engagement faces between the hooking section and the hooking claw such that the sheet-metal parts impart a pressing force to each other, after the assembly, the pressing force due to the taper is normally exerted thereon to thereby prevent loosening of the screw-fixed portions, and also suppress abnormal noise to be generated because of vibration or the like.

INDUSTRIAL APPLICABILITY

The structure for fastening sheet-metal parts together, according to the present invention, enables the pressing force by the tapers to be imparted thereto after assembly to thereby prevent the screw-fixed portion from being loosened, and also enables noise to be prevented from being generated in vibration. Thus, the structure for fastening sheet-metal parts together is suitable for use in a sheet-metal parts fastening structure for assembling a sheet-metal cover to a sheet-metal chassis in an electric apparatus.

The invention claimed is:

1. A chassis assembly for an electronic apparatus comprising:
    a chassis comprising a first sheet-metal part formed of a bottom plate, two opposing side plates each extending upwardly from the bottom plate and having front and rear edges, and a back plate extending upwardly from the bottom plate between the rear edges of the side plates, a top opening of the chassis being defined between the side plates; and
    a cover comprising a second sheet-metal part to be assembled to the first sheet-metal part to cover the top opening of the chassis;
    each of the side plates having an L-shaped hooking section and an assembly guide section formed at an upper edge thereof at the top opening of the chassis, each L-shaped hooking section having an entrance facing the rear edge of the side plate, each assembly guide section being disposed rearwardly of one of the L-shaped hooking sections and dimpling inwardly a portion of the side plate to define a recess having a thickness of the second sheet-metal part;
    the cover comprising a cover plate having opposing side edges, each side edge having a L-shaped hooking claw extending downwardly from the side edge to engage with one of the L-shaped hooking sections and a guide lug extending downwardly from the side edge to engage with one of the assembly guide sections, each L-shaped hooking claw having an entrance facing a front edge of the cover plate, each guide lug being disposed rearwardly of one of the L-shaped hooking claws and being sized to laterally slide within one of the assembly guide sections;
    the back plate having an engaging hole and a tapped hole adjacent an upper edge thereof; and
    the cover plate having an engaging claw for hookingly engaging with the engaging hole and a screw passing hole aligned with the tapped hole for screw-fixing the cover to the chassis, when the guide lugs are engaged with the assembly guide sections and the L-shaped hooking claws are engaged with the L-shaped hooking sections.

2. The chassis assembly according to claim 1, wherein the hooking sections and the hooking claws each having a taper thereon such that entrances thereof widen and roots thereof narrow.

3. The chassis assembly according to claim 1, wherein the engaging claw has a taper, and four corners of the engaging hole are formed with a circular arc portion.

* * * * *